United States Patent [19]
Yun

[11] Patent Number: 5,453,633
[45] Date of Patent: Sep. 26, 1995

[54] DYNAMIC RANDOM ACCESS MEMORY DEVICE AND A MANUFACTURING METHOD THEREOF

[75] Inventor: Joo-young Yun, Seoul, Rep. of Korea

[73] Assignee: Samsung Electronics Co., Ltd., Suwon, Rep. of Korea

[21] Appl. No.: 282,500

[22] Filed: Aug. 1, 1994

Related U.S. Application Data

[62] Division of Ser. No. 142,986, Oct. 29, 1993, Pat. No. 5,389,568.

[30] Foreign Application Priority Data

Oct. 29, 1992 [KR] Rep. of Korea .................. 92-19990

[51] Int. Cl.$^6$ .................................................. H01L 29/68
[52] U.S. Cl. ........................... 257/306; 257/307; 257/308; 257/309
[58] Field of Search ................................. 257/303, 306, 257/307, 308, 309

[56] References Cited

U.S. PATENT DOCUMENTS 5,164,337 11/1992 Ogawa et al. ...................... 257/307

*Primary Examiner*—Edward Wojciechowicz
*Attorney, Agent, or Firm*—Charles R. Donohoe; Robert A. Westerlund, Jr.; Stephen R. Whitt

[57] ABSTRACT

Disclosed is a dynamic random access memory device (DRAM) having an increased cell capacitance and simplified manufacturing method thereof. The storage electrode the capacitor of the DRAM is connected to a semiconductor substrate through an opening formed in an insulating layer, and has a structure having an outer peripheral wall portion with a laterally extending bottom on the insulating layer and an inner central pillar portion including a hole of a certain depth within the opening in the center of the outer peripheral wall portion. Thus, cell capacitance is greatly increased within a limited unit cell area, its reliability is enhanced, and the manufacturing process is distinctly simplified.

11 Claims, 7 Drawing Sheets

DYNAMIC RANDOM ACCESS MEMORY DEVICE AND A MANUFACTURING METHOD THEREOF

This is a division of Application No. 08/142,986, filed Oct. 29,1993 now U.S. Pat. No. 5,389,568 issued Feb. 14, 1995.

BACKGROUND OF THE INVENTION

The present invention relates to a capacitor of a semiconductor memory device and a manufacturing method thereof, and more particularly to a dynamic random access memory (DRAM) device having a greatly increased cell capacitance by means of an advantageously simple manufacturing process, and a manufacturing method of the same.

A DRAM has a plurality of memory cells, each of which generally includes a storage capacitor and a transistor serving as a transfer gate for storing or eliminating charges. The plurality of memory cells are arranged on a substrate in a matrix arrangement and operate to permit only a single cell in the memory to be selected by means of two dimensional addressing within a given time period. A bit line (data line) voltage is supplied to the storage capacitor via a transistor so as to write information on each memory cell. Also, in order to read out the written information, the storage capacitor is connected to the data line via a gate and the voltage of the storage capacitor is thus monitored.

Meanwhile, with the development of semiconductor manufacturing techniques, the memory capacitance (number of elements per chip) in semiconductor memory devices is being increased as much as fourfold every two years. In such a memory device, since the memory cell array occupies a greater part of the chip area, each unit memory cell area must be shrunk to achieve larger capacitance and higher packing density, based upon the proportional reduction rule. However, a decrease of the memory cell area necessarily results in a decrease of the capacity of a stored change which should be stored within a minute memory cell for data storage.

This decrease of capacitance lowers the data read-out capability of the device and, because of α-particles, raises its soft error rate. It also impedes low voltage operation which consumes excessive electric power. Therefore, these problems must be solved before higher packing density of a semiconductor device can be achieved.

Generally, to increase the capacitance within a limited area, methods to increase the surface area of a capacitor's storage electrodes are being explored, as is decreasing the thickness of a dielectric film of the capacitor or increasing dielectric constant of the dielectric film etc. Among these, proposed structures for increasing the surface area of the storage electrode include a stacked capacitor, a trenched capacitor, and a combined capacitor. Here, since the stacked capacitor is simple in view of its manufacturing process as compared with the trenched capacitor and more immune to soft errors, studies on the stacked capacitor are being carried out in megabit-DRAMs.

On the other hand, sufficient capacitance cannot be obtained by a conventional two-dimensional stacked capacitor in 64 Mbit DRAMs which are generally restricted to a memory cell area of about 1~1.5 μm$^2$ even though a high-dielectric material, e.g., $Ta_2O_5$, is used. Stacked capacitors having a three-dimensional structure have been therefore suggested. For example, the double-stacked structure, fin structure, cylindrical electrode structure, spread-stacked structure, and box structure are three-dimensional storage electrodes suggested to increase the cell capacitance of the memory cell.

Among the above three-dimensional stacked capacitor structures, the cylindrical structure can utilize not only the outer surface of the cylinder but also the inner surface thereof as an effective capacitor area, so it is adaptable to memory cells of 64 Mb and higher. Currently, another such capacitor structure for increasing the cell capacitance is being suggested by adding a bar or another cylinder in the interior of the cylinder.

The former is disclosed in a paper entitled: "Crown-shaped Stacked-capacitor Cell for 1.5 V Operation 64Mb DRAMs" (Toru Kaga et al., IEEE Electron Devices, Vol. 38, No. 2, pp. 255~260, 1991), wherein another cylinder is added in the interior of the cylindrical storage electrodes.

The latter is disclosed in a paper entitled: "A-Stacked Capacitor Cell with Ring Structure" (N. Shinmura et al., 22nd conference on SSDM, Part II, pp. 833~836, 1990). Here, a bar is added inside the cylindrical storage electrode, so that the outer and inner surfaces of the cylinder as well as the outer surface of the bar included in the interior of the cylinder can be the effective capacitor area. Thus, the cell capacitance can be increased to the desired extent. However, its manufacturing method and, therefore, mass production are difficult.

FIGS. 1 through 4 are sectional views for illustrating a manufacturing method of a semiconductor memory device presented by Toru Kaga et al., which particularly, in a method for manufacturing a DRAM, relate to a method for forming a capacitor on a structure having a transistor being a constituent of the memory cell of the DRAM on a semiconductor substrate.

Referring first to FIG. 1, a typical manufacturing process of a DRAM before forming its capacitor will be described below.

An active region is separated from an isolation region 101 field oxide layer 101 on a semiconductor substrate 100 by means of a common isolation method, e.g., LOCal Oxidation of Silicon (LOCOS). Successively, transistors having a source region 4 and a gate electrode 2 and commonly shared bit line 6 and drain region 5 are formed on the active region, using common semiconductor manufacturing methods such as deposition, photolithography, and ion-implantation. Thereafter, on the surface of the resultant structure, an insulating layer 8 for insulating each transistor from other conductive layers (to be formed later) is formed. Then, a planarizing layer 10 composed of an insulating material is formed on the surface of the resultant structure.

FIG. 1 is a sectional view showing a step of forming a portion of the storage electrode of the capacitor on the structure having elements up to planarizing layer 10. In more detail, insulating layer 8 and planarizing layer 10 stacked on source region 4 of the transistor are partially removed to thereby form a contact hole. Successively, the contact hole is filled with a first polycrystalline silicon to thus form a bar electrode 16. Then, a first silicon dioxide layer 12, a silicon nitride layer 14, and a second silicon dioxide layer 18 are sequentially stacked. Thereafter, the stacked second silicon dioxide layer 18, silicon nitride layer 14 and first silicon dioxide layer 12 are consecutively etched back to define each memory cell unit and expose a surface of bar electrode 16 so that a well is formed. A material for forming the storage electrode, e.g., a polycrystalline silicon, is deposited on the whole surface of the resultant structure, thereby forming a second polycrystalline silicon layer 20. Also, a third silicon dioxide layer is deposited on second polycrystalline silicon layer 20 and then is anisotropically etched to form a spacer 22 on the sidewall of second polycrystalline silicon layer 20 inside each well.

Referring to FIG. 2, on the surface of the semiconductor substrate having second polycrystalline silicon layer 20 and the spacer 22, a material for forming the storage electrode together with second polycrystalline silicon layer 20, (e.g., a polycrystalline silicon), is deposited to thereby form third polycrystalline silicon layer 24. Thereafter, a fourth silicon dioxide layer 26 is formed on the whole surface of the resultant structure, to cover the surface of third polycrystalline silicon layer 24.

Referring to FIG. 3, fourth silicon dioxide layer 26 is etched back to approximately the height of the peak surface of spacer 22, such that fourth silicon dioxide layer 26 is partially removed. Then, third polycrystalline silicon layer 24 having the exposed surface is removed by means of an anisotropic etching, until the surface of second polycrystalline silicon layer 20 is exposed. Thereafter, second and third polycrystalline silicon layers 20 and 24 whose tops are exposed by means of the anisotropic etching are further anisotropically etched until second polycrystalline silicon layer 18 is exposed, thereby forming a storage electrode 28 of the capacitor. At this time, storage electrode 28 has a larger cylinder formed from second polycrystalline silicon layer 20 and a smaller cylinder formed from third polycrystalline silicon layer 24 within the interior of the larger cylinder on bar electrode 16 formed from the first polycrystalline silicon layer.

Referring to FIG. 4, fourth silicon dioxide layer 26, spacer 22 and second dioxide layer 18 which remain on the resultant structure are eliminated to thereby expose the surfaces of storage electrode 28 of the capacitor. Next, a dielectric film 30 is formed on the whole surface of storage electrode 28, and a fourth polycrystalline silicon is deposited thereon to form a plate electrode 32 of the capacitor, thereby completing the capacitor structure of the DRAM.

According to the conventional method for manufacturing the above-described semiconductor memory device, the storage electrode of the capacitor has another cylinder within a cylinder, so that the effective surface area can be increased, which in turn increases cell capacitance. However, there are several problems with this method.

First, when the first polycrystalline silicon fills up a contact hole for the bar electrode (16 in FIG. 1) formation, the shape of the cylinder formed on the polycrystalline silicon is influenced by the state of the filling of the first polycrystalline silicon. Therefore, it is important to accurately fill the first polycrystalline silicon, (i.e., in the contact hole portion only), but this process is too difficult to be carried out with assurance.

Second, during the step for anisotropically etching second silicon dioxide layer 18, silicon nitride layer 14 and first silicon dioxide layer 12 in order to form the well (the portion formed by partially eliminating the first silicon dioxide layer, silicon nitride layer and second silicon dioxide layer in FIG. 1) for defining the storage electrode, a slope of the sidewall of the well is apt to be negative (namely, the amount of material etched in the surface region of the sidewall is smaller than that being etched in the bottom), so that voids are created between the storage electrode and the plate electrode when forming the plate electrode. Thus, the electrical characteristics of the memory device are diminished.

Third, since the degree of etching is difficult to adjust when etching back fourth silicon dioxide 26 (refer to FIG. 3 and corresponding description), the effective surface area of the storage electrode varies according to the amount of etching so that it is difficult to obtain uniform cell capacitance.

Fourth, when forming third polycrystalline silicon layer 24 after forming second polycrystalline silicon layer 20 (refer to FIG. 2 and corresponding description), a thin natural oxide layer forms on the second polycrystalline silicon layer 20, which also degrades the electrical characteristics of the memory device.

Fifth, the tops of the cylindrical electrode are sharply formed, so that leakage currents are possible.

Sixth, the manufacturing cost is raised due to an overly complicated manufacturing process.

SUMMARY OF THE INVENTION

Accordingly, the present invention is offered to solve the above-mentioned problems of the conventional technique.

It is an object of the present invention to provide a DRAM device having an improved cell capacitance without decreasing its packing density.

It is another object of the present invention to provide a DRAM device with a cell capacitor having improved reliability.

It is yet another object of the present invention to provide a DRAM device which can be manufactured by an advantageously simplified process.

It is still another object of the present invention to provide a simplified method suitable for manufacturing the DRAM device according to the present invention.

A basic characteristic of the present invention to achieve the above objects is in that, in the DRAM, the surface area of a storage electrode of a capacitor is increased to maximize an effective capacitor area within a limited space.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

FIGS. 5 through 9 are sectional views for illustrating one embodiment of a method for manufacturing a DRAM according to the present invention.

Figure 1:
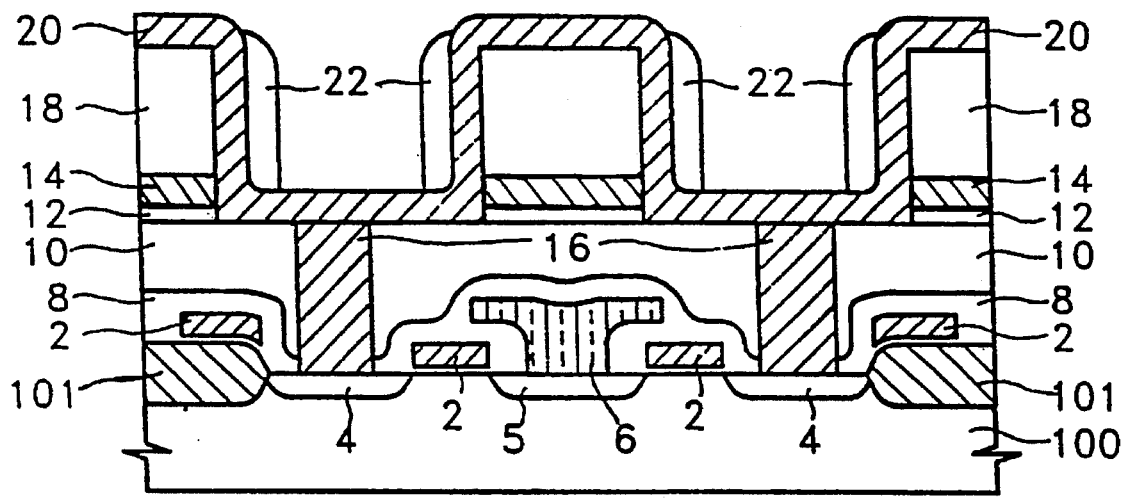
FIGS. 1 through 4 are sectional views illustrating a manufacturing method of a conventional DRAM.
Figure 2:
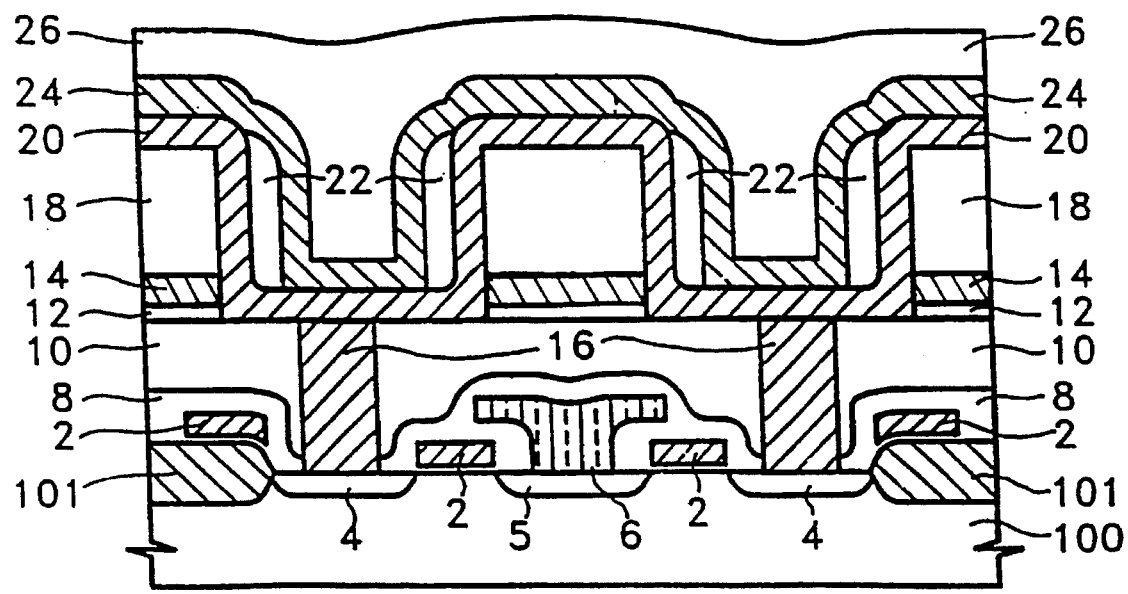
Figure 3:
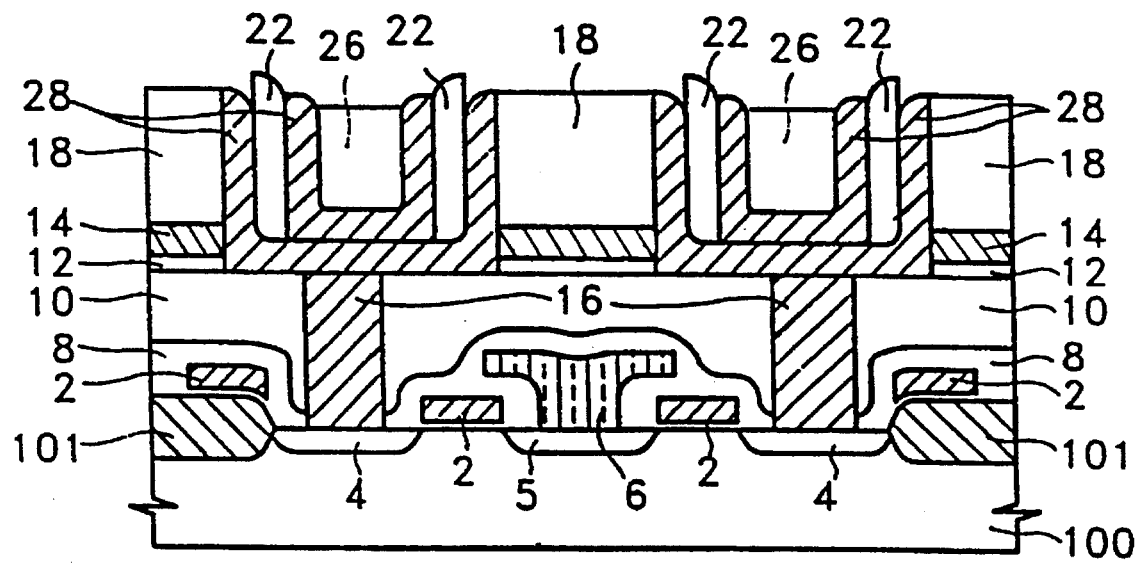
Figure 4:
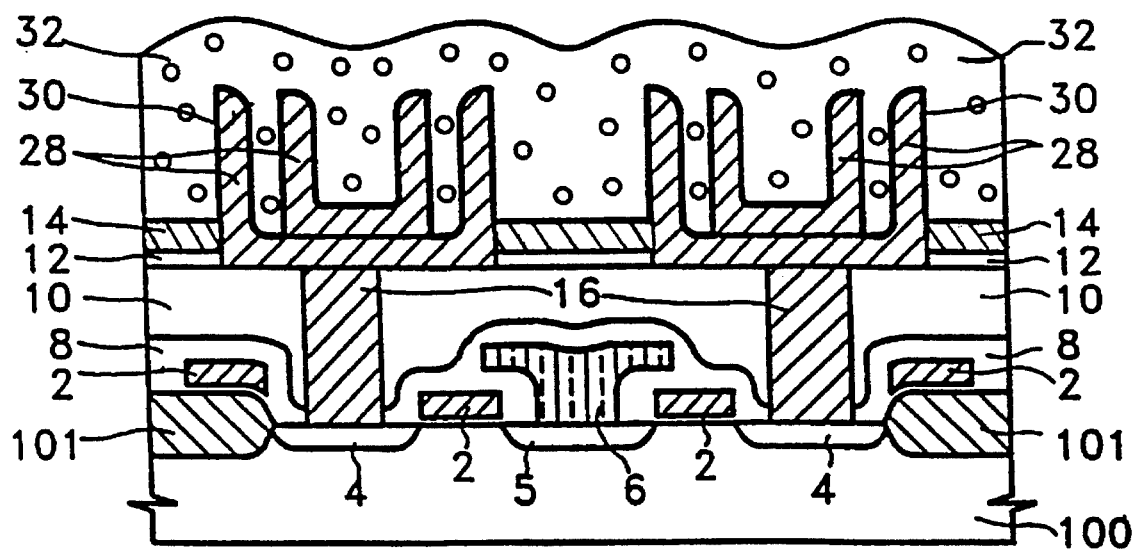
Figure 5:
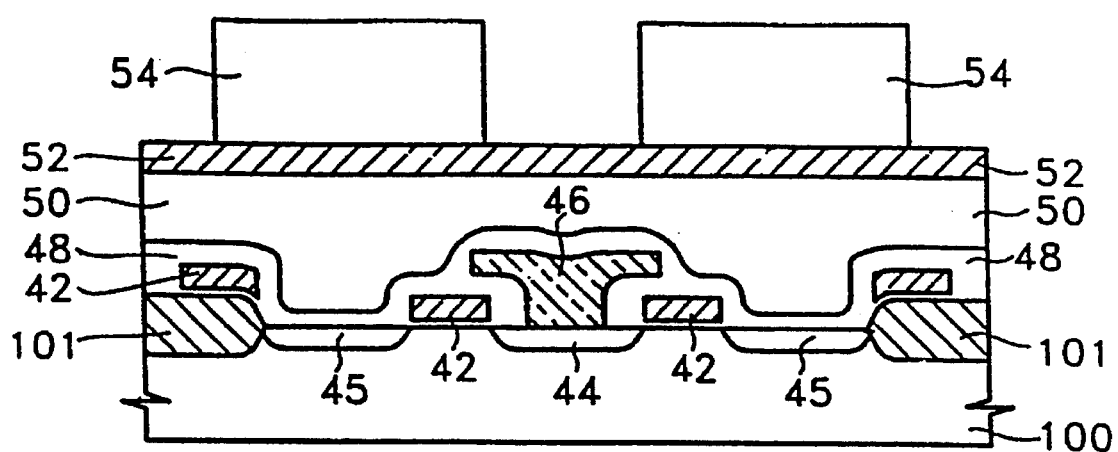
FIGS. 5 through 9 are sectional views illustrating one embodiment of a method for manufacturing a DRAM according to the present invention.

Referring to FIG. 5, the steps up to forming a first insulating layer 50 on a structure which has a transistor on a semiconductor substrate 100 are the same as the above-described conventional method. In more detail, an active region is separated from an isolation region 101 having a thicker field oxide layer than adjacent portions on a semiconductor substrate 100 by means of an ordinary isolation method, (e.g., a LOCOS method). The transistors (each having a source region 45 and a gate electrode 42 and commonly sharing a bit line 46 and a drain region 44) are formed on the active region, using common semiconductor manufacturing methods such as deposition, photolithography and ion-implantation. Thereafter, on the whole surface of the resultant structure, an insulating layer 48 for insulating the transistor from other conductive layers (to be formed later) is formed. An insulating material, (e.g., an oxide), is then coated on the whole surface of the resultant structure to a thickness of about 5,000 Å~6,000 Å, and then planarized to form first insulating layer 50. These are typically used manufacturing steps, and the manufacturing process relating to the present invention will now be described.

After forming first insulating layer 50, a first conductive layer 52 is formed by depositing a material, (e.g., polycrystalline silicon), to a thickness of about 500 Å~1,000 Å on first insulating layer 50. A first insulation material layer (e.g., oxide), is deposited on the surface of first conductive layer 52 to a thickness of about 4,000 Å~5,000 Å, and then is planarized. After forming a photoresist pattern (not shown) for defining unit cells, the first insulating material layer is anisotropically etched to form a first insulating pattern 54 which is defined into an individual unit cell, using the photoresist pattern as an etching-mask. Here, first pattern 54 is formed directly above source region 45 of semiconductor substrate 100 to allow an opening to be subsequently formed onto source region 45.

Figure 6:
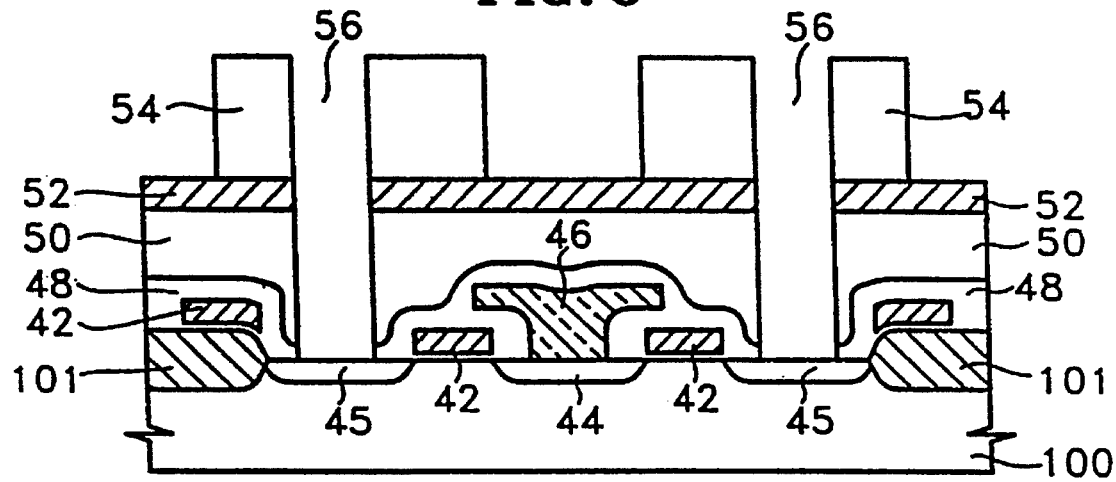

Referring to FIG. 6, in order to electrically connect source region 45 and the storage electrode of the capacitor, the insulating layer 48, first insulating layer 50, first conductive layer 52 and first pattern 54 are partially etched via a general photolithography process, thereby forming an opening 56 over the source region 45.

Figure 7:
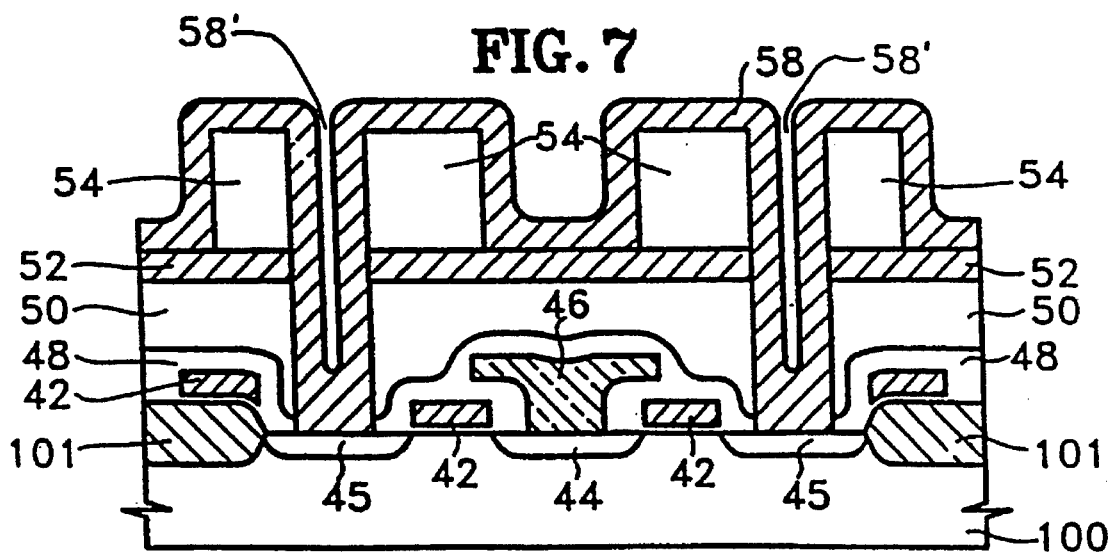
Figure 8:
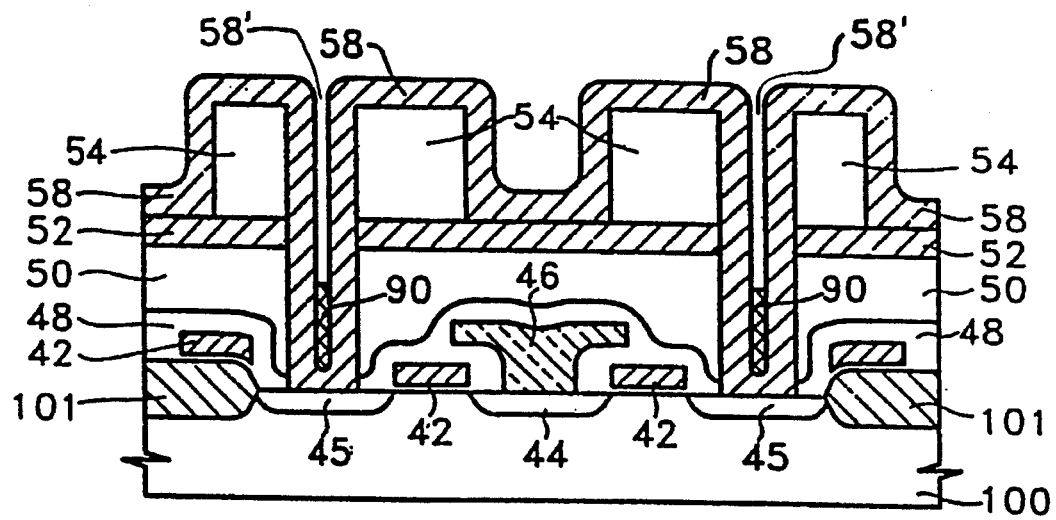

Referring to FIG. 7; a material such as polycrystalline silicon is deposited to a thickness of approximately 500 Å~1,000 Å on the surface of the resultant structure having the etched first insulating pattern 54 thereon, thereby forming a second conductive layer 58. At this time, if opening 56 formed during the step shown in FIG. 6 is small, the material forming second conductive layer 58 is thickly deposited in the bottom of opening 56 compared to the other portions of opening 56, which is preferable. If the size of opening 56 is relatively large, it is not thickly deposited in the bottom of opening 56, and the material may be removed during the following etching process of second conductive layer 58. Thus, as shown in FIG. 8, in order to prevent over-etching, after depositing second conductive layer 58, a photoresist (or oxide) 90 is coated on the whole surface of the resultant structure. Thereafter, the photoresist (oxide) is etched back to leave the photoresist (or oxide) 90 in a lower portion of opening 58', and second conductive layer 58 is etched via an anisotropic etching. Then, second conductive layer 58, deposited on the lower portion of opening 56, remains even after performing the anisotropic etching process, thereby achieving greater cell reliability.

Figure 9:
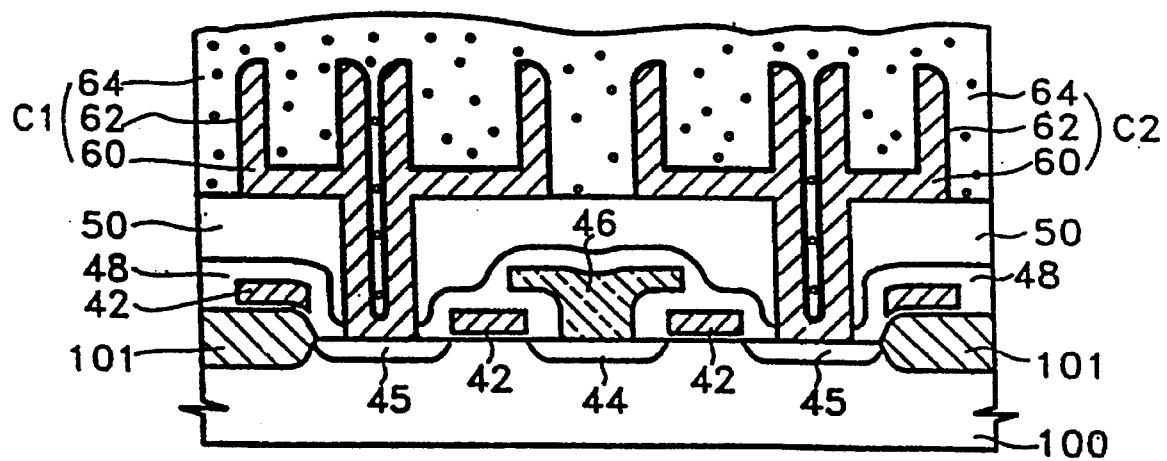

Referring to FIG. 9, an anisotropic etching is carried out on the whole surface of second conductive layer 58 coated on the uppermost surface of the resultant structure obtained in FIG. 7, until a first insulating pattern 54 is exposed. Therefore, a double cylindrical storage electrode 60 composed of portions of first conductive layer 52 and second conductive layer 58 is formed. In more detail, storage electrode 60 is formed along the sidewall of opening 56 to thereby be connected to source region 45 and extends laterally along the first insulating layer 50, thus forming the outer cylinder. Also, another cylinder is formed inside the outer cylinder, thus forming the double cylinder. Then, a material having a high dielectric constant, (e.g., silicon nitride (SIN) or SiN/oxide), is coated on the surface of the resultant structure, forming a dielectric film 62. Then, a conductive material, (e.g., polycrystalline silicon) is coated on the whole surface of the resultant structure, thereby forming a plate electrode 64. Finally, each capacitor C1 and C2 comprised of storage electrode 60, dielectric film 62 and plate electrode 64 are completed.

In the embodiment of the present invention, the effective surface area of the storage electrode is increased within a limited space as compared with the capacitor of the conventional DRAM, so that a DRAM having an increased cell capacitance can be realized.

Moreover, the manufacturing process is very simplified in its formation of the storage electrode of the capacitor, requiring only a two-part step of stacking first and second conductive layers 52 and 58, and only a single step of etching second conductive layer 58.

Figure 10:
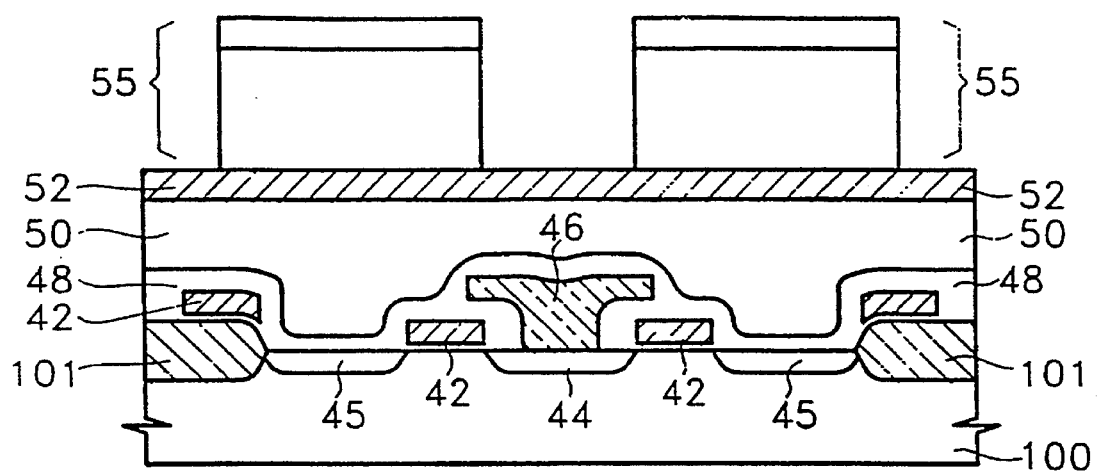
FIGS. 10 through 12 are sectional views illustrating another embodiment of the method for manufacturing a DRAM according to the present invention.
Figure 11:
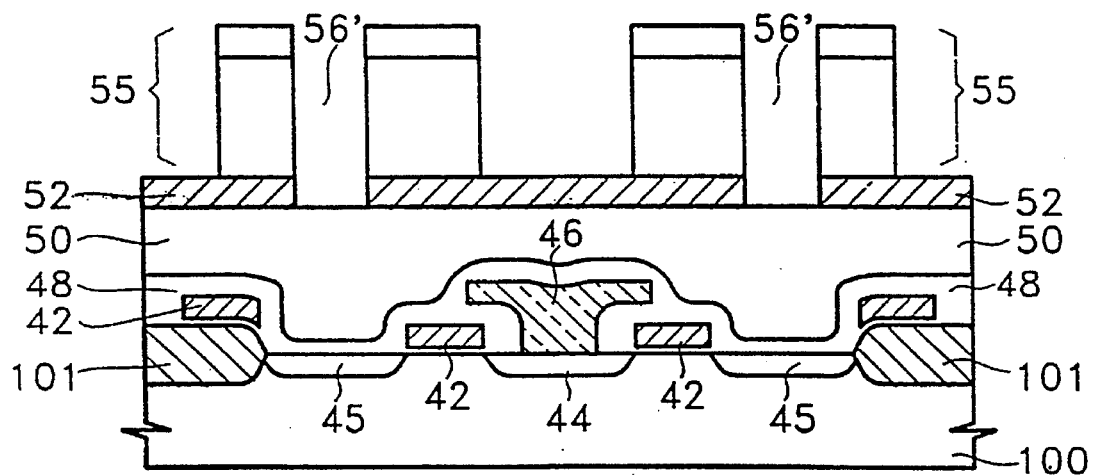
Figure 12:
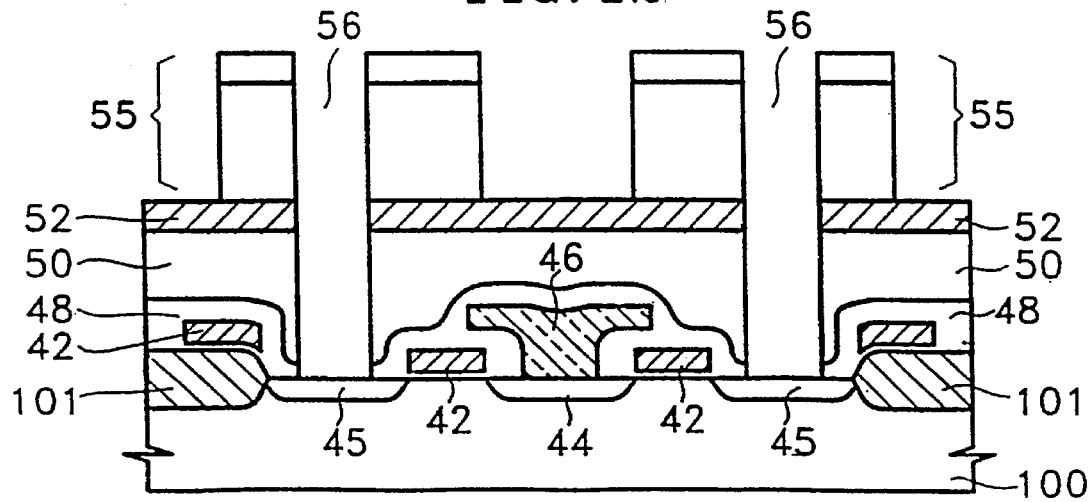

FIGS. 10 through 12 are sectional views for illustrating the manufacturing process of the DRAM according to another embodiment of the present invention.

In FIG. 5 as described above, since a thicker first insulating material layer heightens the cylinder of storage electrode 60, the effective surface area of storage electrode 60 is increased accordingly to thereby increase the capacitor cell capacitance. In the present invention, the thickness of the first material layer is approximately 4,000~5,000 Å or higher, which may be adjusted according to a desired cell capacitance. However, as the thickness of the first material layer is increased, it is difficult to obtain an accurate vertical profile when forming a first pattern 54 with respect to the first material layer using a photoresist pattern (not shown) in FIG. 5, and etching the first conductive layer 52 and first insulating layer 50 by the photoresist pattern (not shown) in FIG. 6. This also causes variations in the cell capacitance.

Accordingly, the embodiment shown in FIGS. 10, 11 and 12 is for improving the above-described problems. Here, the same reference numerals as those of FIGS. 5 through 9 designate the same elements.

Referring to FIG. 10, the step of forming first insulating layer 50 to have a planarized surface on semiconductor substrate 100 which has the transistor and bit line 46 is identical to that of the conventional technique. First insulating layer 50 is composed of an insulating material, (e.g., oxide), and having a thickness of about 5,000 ~6,000 Å. A first conductive layer 52 having a large etch selectivity with respect to first insulating layer 50 is formed thereon. First conductive layer 52 is composed of a material such as polycrystalline silicon which is formed to a thickness of approximately 500 Å~1,000 Å. After stacking a first material layer and a fourth conductive layer, a second pattern 55 consisting of the stacked first material layer and fourth conductive layer is formed via a typical photolithography process. At this time, the second pattern 55 is defined into individual memory cell units formed above respective source regions 45 of the transistor on semiconductor substrate 100. In the meantime, the fourth conductive layer is formed of a material having a large etch selectivity with respect to the first material layer, (e.g., polycrystalline silicon), at a thickness of about 500 ~1,000 Å.

Referring to FIG. 11, a photoresist (not shown) is coated on the whole surface of the resultant structure, and is etched via a general photolithography technique to form a photoresist pattern. Thereafter, a preparatory opening 56' is formed by partially etching second pattern 55, using the photoresist pattern as an etching-mask. Also, preparatory opening 56' should be formed directly above source region 45.

Referring to FIG. 12, the photoresist pattern (not shown) is eliminated, and the first insulating layer 50 is etched to expose source regions 45, thereby forming openings 56.

Then, the following capacitor formation steps, such as forming a second conductive layer (composed the same material as layer 58 in FIG. 7) on the whole surface of the resultant structure, and anisotropically etching the resultant structure to form the storage electrode, are the same as shown in FIGS. 7 through 9.

According to the embodiment shown in FIGS. 10 through 12, a storage electrode having a vertically accurate profile can be obtained, so that a DRAM having a cell capacitor with an improved reliability can be realized.

Figure 13:
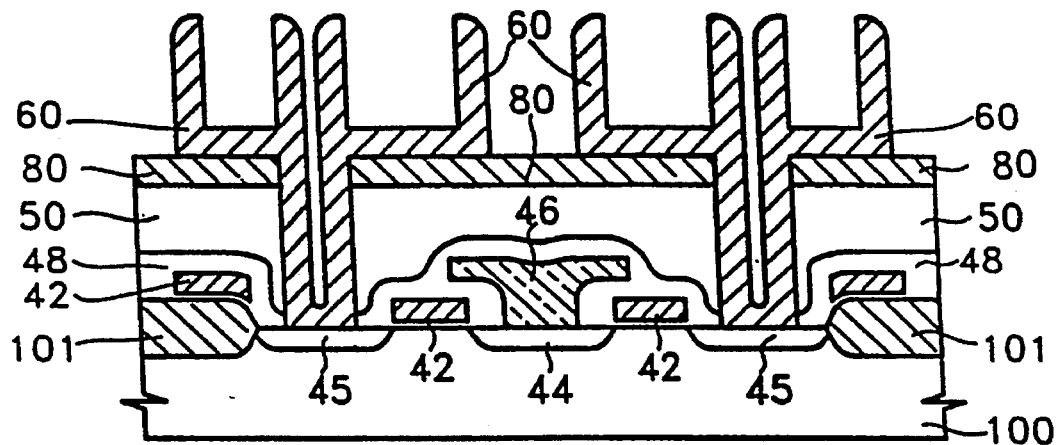
FIGS. 13 and 14 are sectional views illustrating yet another embodiment of the method for manufacturing the DRAM according to the present invention.
Figure 14:
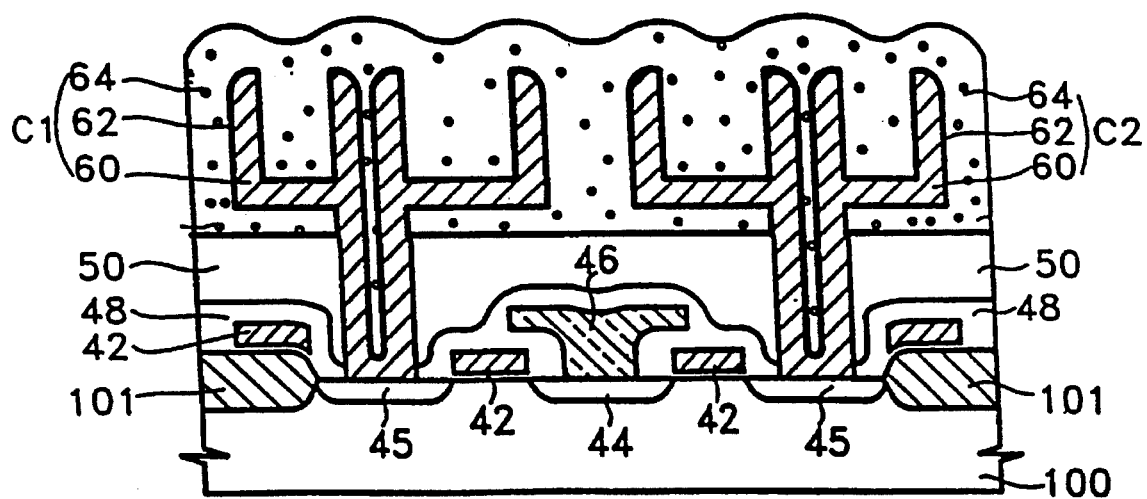

FIGS. 13 and 14 are sectional views for illustrating the manufacturing process of a DRAM according to yet another embodiment of the present invention, which also increases the effective area of the capacitor.

Referring to FIG. 13, the steps up to the formation of first insulating layer 50 having a planarized surface on semiconductor substrate 100 having one or more transistors are identical to those of the conventional technique. Then, a material having an etch rate different from that of a material constituting first insulating layer 50, (e.g., SiN when first insulating layer 50 is composed of silicon oxide), is stacked on first insulating layer 50 to thereby form a second material layer 80. Next, the succeeding steps are performed in the same method illustrated in FIGS. 5 through 8, thereby completing a storage electrode 60 having double cylinder.

Referring to FIG. 14, an etching of second material layer 80 stacked on first insulating layer 50 is carried out on the whole surface of the resultant structure, so that the lower surface of cylindrical storage electrode 60 is spaced away from first insulating layer 50 so as to be utilized to increase the effective area of the capacitor as shown in the drawing. Then, by forming dielectric film 62 and plate electrode 64, the capacitor is completed.

According to this embodiment, a further increase in cell capacitance can be obtained.

Figure 15:
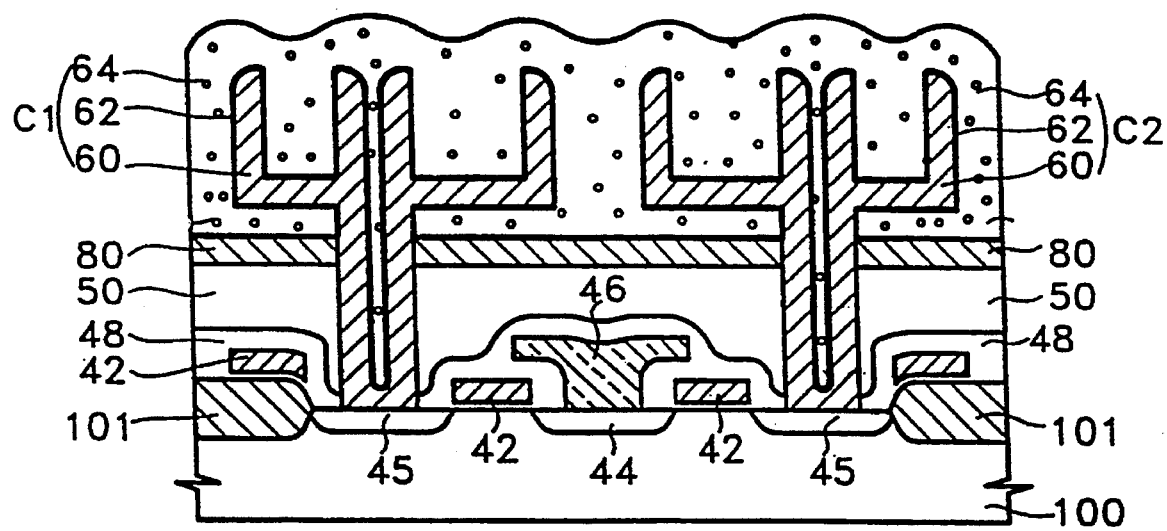
FIG. 15 shows the DRAM manufactured according to still another embodiment of the present invention.

FIG. 15 is a sectional view of the DRAM showing still another embodiment of the present invention. In the embodiment shown in FIGS. 13 and 14, during the steps of etching so as to remove second material layer 80, the polycrystalline silicon constituting storage electrode 60 may be etched. This changes the effective area of the capacitor, which can lower the reliability of the DRAM. Therefore, as shown in FIG. 15, a third material layer (not shown) having a better etch selectivity than second material layer 80 with respect to the polycrystalline silicon constituting the storage electrode 60, (e.g., an oxide layer), is stacked on second material layer 80, so that the capacitor can be completed by performing the succeeding process as described in the above-described embodiments.

In the embodiments relating to the method for manufacturing the DRAM of the present invention and to the corresponding description of the DRAM according to the present invention expressed and described as above, the cell capacitance is greatly increased within a limited unit cell area, and the reliability with respect to the cell capacitor is enhanced. Furthermore, as compared with the conventional method, a DRAM having an increased cell capacitance via a simplified manufacturing process. Meanwhile, a material employed in the present invention, is not limited in the materials presented above, but can be substituted by various materials with proper properties. In addition to this, the dimensions of respective structures constituting the present invention is not limited in the above embodiments.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A semiconductor memory device having a capacitor, comprising:

(a) a semiconductor substrate having at least one transistor with a source region formed thereon;

(b) an insulating layer formed over said substrate having said at least one transistor thereon, said insulating layer having an opening therethrough exposing said source region of said at least one transistor;

(c) a capacitor storage electrode comprising:

(1) an central pillar portion extending through said opening in said insulating layer and electrically connected to said source region, said central pillar portion having a longitudinal bore therein which extends downwardly towards said source region; and (2) a bottom portion extending outwardly from said central pillar portion at a point along said central pillar portion on or above an upper surface of said insulating layer;

(d) a dielectric film formed over said storage electrode; and (e) a plate electrode formed over said dielectric film and electrically insulated from said storage electrode.

2. A semiconductor memory device as claimed in claim 1, wherein a lower surface of said bottom portion of said storage electrode is spaced away from said insulating layer.

3. A semiconductor memory device as claimed in claim 2, wherein said dielectric film covers said lower surface of said bottom portion of said storage electrode.

4. A semiconductor memory device as claimed in claim 1, wherein said insulating layer is an oxide.

5. A semiconductor memory device as claimed in claim 1, wherein said insulating layer is a compound layer comprising an oxide layer and a silicon nitride layer.

6. A semiconductor memory device as claimed in claim 1, wherein said storage electrode is made from a polycrystalline silicon.

7. A semiconductor memory device as claimed in claim 1, wherein said bottom portion of said storage electrode is between about 500 Å and 1000 Å thick.

8. A semiconductor memory device as claimed in claim 1, wherein said capacitor storage electrode further includes a peripheral wall portion extending substantially perpendicularly from said bottom portion and parallel to said central pillar portion in a direction opposite said source region.

9. A semiconductor-memory device as claimed in claim 1, wherein said longitudinal bore in said central pillar portion extends towards said source region past said bottom portion.

10. A semiconductor memory device as claimed in claim 8, wherein said outer peripheral wall portion of said storage electrode is between about 500 Å and 1000 Å thick.

11. A semiconductor memory device as claimed in claim 1, wherein said bottom portion is spaced away from said insulating layer.

* * * * *